United States Patent [19]
Shiomi et al.

[11] Patent Number: 5,998,729
[45] Date of Patent: Dec. 7, 1999

[54] SOLAR CELL MODULE HAVING IMPROVED FLEXIBILITY

[75] Inventors: Satoru Shiomi, Kyotanabe; Kimitoshi Fukae, Nara; Hidehisa Makita, Kyotanabe; Shigenori Itoyama, Nara, all of Japan

[73] Assignee: Canon Kabushiki Kaisha, Tokyo, Japan

[21] Appl. No.: 09/058,559

[22] Filed: Apr. 13, 1998

[30] Foreign Application Priority Data

Apr. 11, 1997 [JP] Japan .................................. 9-093705

[51] Int. Cl.⁶ ...................................... H01L 25/00
[52] U.S. Cl. ..................... 136/251; 136/256; 52/173.3
[58] Field of Search .................... 136/251, 256; 52/173.3

[56] References Cited

U.S. PATENT DOCUMENTS

| | | | |
|---|---|---|---|
| 4,401,839 | 8/1983 | Pyle | 136/251 |
| 4,419,531 | 12/1983 | Lang et al. | 136/251 |
| 5,133,810 | 7/1992 | Morizane et al. | 136/251 |

FOREIGN PATENT DOCUMENTS 7-302924  11/1995  Japan .

*Primary Examiner*—Mark Chapman
*Attorney, Agent, or Firm*—Fitzpatrick, Cella, Harper & Scinto

[57] ABSTRACT

A solar cell module comprising a cell block sealed by a sealing resin, said cell block comprising a plurality of solar cells electrically connected with each other by an electrically conductive connection material, characterized in that a sliding material having a property of not bonding to said electrically conductive connection material but bonding to said sealing resin is interposed between said electrically conductive connection material and said sealing resin.

39 Claims, 14 Drawing Sheets

F I G. 3
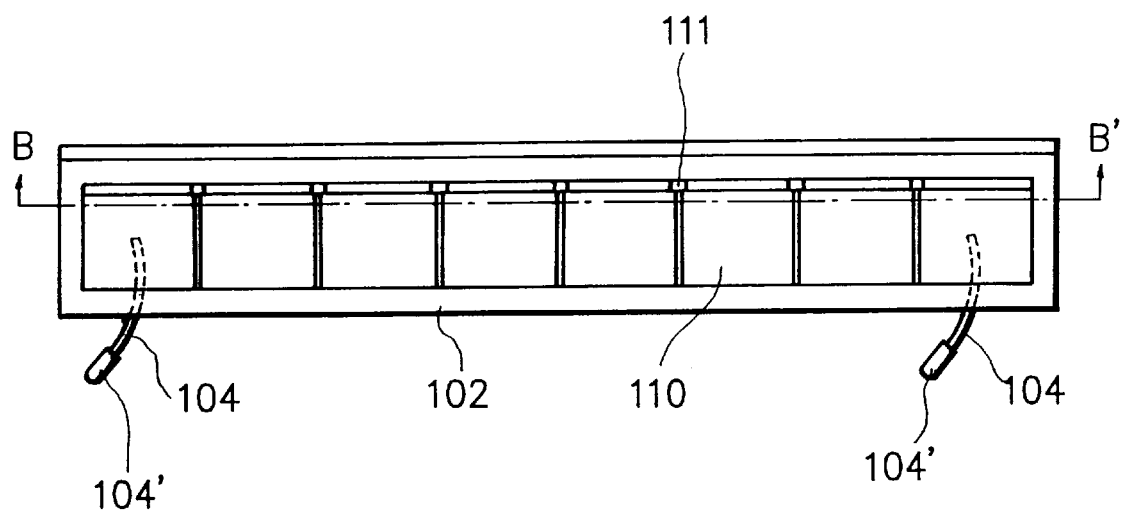

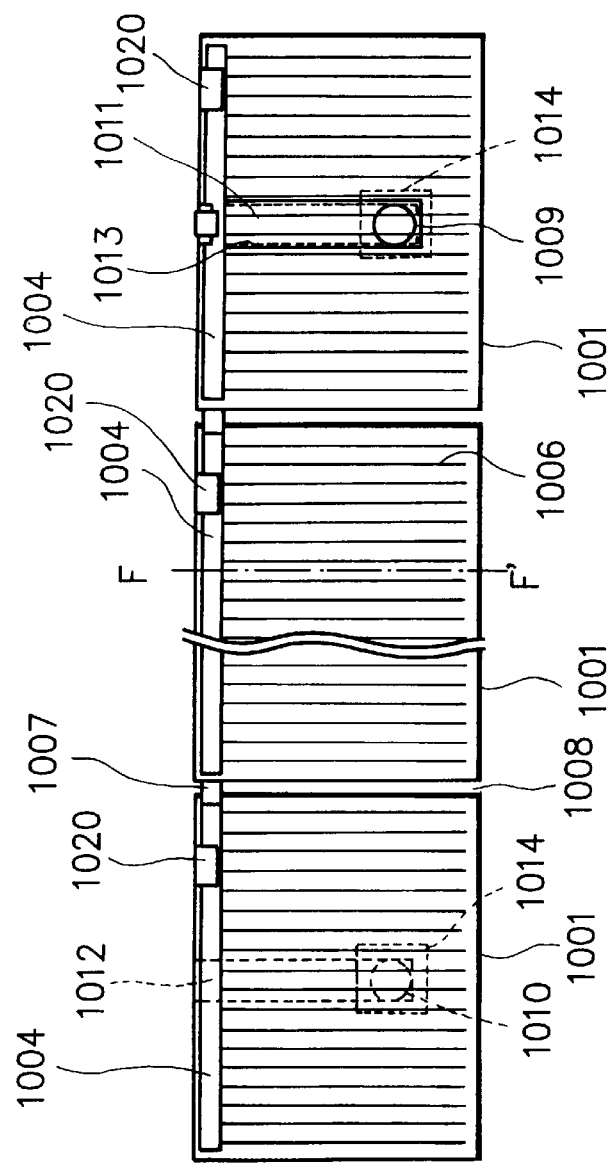

SOLAR CELL MODULE HAVING IMPROVED FLEXIBILITY

BACKGROUND OF THE INVENTION

1. Field of the Invention

The present invention relates to a solar cell module having an improved reliability against folding. More particularly, the present invention relates to a highly reliable solar cell module which excels in flexibility and has good exterior appearance and which can be freely bent and can be used as a building material such as a roofing material.

2. Related Background Art

There have been proposed a variety of so-called roof-integral type solar cell modules capable for use as a roofing material of a building by integration with other roofing materials. These solar cell modules are usually produced in a manner of electrically connecting a plurality of solar cells with each other in series connection by an electrically conductive connection material into a cell block comprising the solar cells integrated in series connection, sealing said cell block on a reinforcing member using a sealing resin into a module, and bending the reinforcing member of the module as desired.

For instance, Japanese Unexamined Patent Publication No.302924/1995 (hereinafter referred to as Japanese document '924) discloses a roof-integral type solar cell module shaped in a plate-like form which can be provided at a reasonable cost on the market for the following reasons. This solar cell module has good compatibility with ordinary roofing material, and it can be readily installed by way of ordinary roofing work where hanging tools and the like used in ordinary roofing work can be used. In addition, the solar cell module can be readily processed into an appropriate roof-shaped solar cell module by means of a roll former making machine without using extra instruments.

In Japanese document '924, there is described a roof-integral type solar cell module processed by way of forming using a roll former making machine to have a shape suitable for crosswise roofing. The solar cells in this solar cell module are arranged in a flat area of the module so as to prevent them from suffering from stress upon the forming treatment and the like. Particularly, this solar cell module shaped suitable for crosswise roofing comprises a flat portion having the solar cells arranged therein, a solar cell-free ridge side meshing portion and a solar cell-free eaves side meshing portion, wherein the ridge side meshing portion and the eaves side meshing portion function as fixing means when the solar cell module is installed.

Now, for the configuration for a solar cell module used as a roofing material, there are known a roll-like configuration, a roof tile-like configuration, a flat configuration, and the like.

Recently, there is a demand on the market for providing a solar cell module having a curved configuration such as a corrugated configuration which is usable as a roofing material.

Besides, there is also a demand on the market for providing a solar cell module having no reinforcing member and which can be freely bent.

In the case of a conventional solar cell module in which a plurality of solar cell modules integrated in series connection by means of an electrically conductive connection material are held on a reinforcing member while being sealed by a sealing resin, when the solar cell module is bent into a desired shape, a problem is likely to occur in that the electrically conductive connection material cracks because it is difficult to bend.

FIG. 14 is a schematic cross-sectional view illustrating the constitution of an example of such a conventional solar cell module.

The solar cell module shown in FIG. 14 comprises a cell block comprising a plurality of solar cells 1402 electrically connected with each other by an electrically conductive connection material 1405 and which is sealed by a resin filler material 1403 on a reinforcing member 1401 while covering a front side of the cell block by a surface protective film 1404. The solar cell module shown in FIG. 14 has a curved shape formed by bending the reinforcing member 1401.

In the following, description will be made of a stress caused at a bent portion in the solar cell module when the reinforcing member 1401 is bent.

Corrugation of the solar cell module as shown in FIG. 14 is conducted by bending the reinforcing member 1401. In bending the reinforcing member 1401 in this case, a neutral line 1410 of the reinforcing member 1401 is engaged in the bending as a processing neutral line. Because of this, a portion of the sealed area having a radius of curvature which is smaller than that of the processing neutral line 1410 suffers from a shrinkage force. Particularly, the solar cell 1402 or the electrically conductive connection material 1405 situated in a recessed portion suffers from a shrinkage force to deform. Similarly, the solar cell 1402 or the electrically conductive connection material 1405 situated in a portion of the sealed area having a radius of curvature which is smaller than that of the processing neutral line 1410 suffers from an extension force to extendedly deform.

In view of this situation, in the case where the solar cell module is subjected to bending treatment using the foregoing roll former making machine, the bending treatment is conducted with due care so that pressure is not applied on the solar cell-bearing portions. However, in the case where the solar cell module is processed to have a corrugated shape as shown in FIG. 14 by way of press working, the solar cell-bearing portions unavoidably suffer from pressure, where such deformation due to the extension or shrinkage as described in the above occurs.

Separately, based on the description of the Japanese document '924, the present inventors prepared a solar cell module having the configuration shown in FIG. 14. Particularly, there was first prepared a solar cell module which comprises a cell block comprising a plurality of solar cells 1402 electrically connected with each other by an electrically conductive connection material 1405 and which is sealed by a resin filler material 1403 on a reinforcing member 1401 while covering a front side of the cell block by a surface protective film 1404. The solar cell module was processed to have such a corrugated shape as shown in FIG. 14.

For the resultant solar cell module, evaluation was conducted. As a result, the solar cell module was not problematic at the beginning stage. But in a weathering test, the solar cell module was found to have such problems as will be described in the following. The electrically conductive connection materials 1405 (which connect the solar cells 1402 in series connection) situated in the recessed and protruded portions of the corrugated shaped and which are curved along the recessed and protruded portions tend to partially separate from the resin filler material 1403 covering the electrically conductive connection materials 1405 due to a difference of curvature R between their inside diameter and their outside diameter, where cracking is likely to occur at the electrically conductive connection materials 1405.

By the way, in the case of a solar cell module which is not provided with a reinforcing member, it is necessary that its power outputting terminals be sufficiently flexible and highly reliable.

SUMMARY OF THE INVENTION

The present invention makes it an object to eliminate the foregoing problems found in the prior art and to provide an improved solar cell module which is free of said problems and satisfies the foregoing demands.

Another object of the present invention is to provide a highly reliable solar cell module which excels in flexibility and has good exterior appearance and which can be freely bent and can be used as a building material such as a roofing material.

A further object of the present invention is to provide a highly reliable roof-integral type solar cell module comprising a power genarating cell block sealed by a sealing resin and which has a specific sliding material which desirably protects an electrically conductive connection material or/and a power outputting means used in said solar cell module. Said solar cell module excels in flexibility and has a good exterior appearance, and it can be freely bent and can be used as a building material such as a roofing material.

BRIEF DESCRIPTION OF THE DRAWINGS

FIG. 3 is a schematic plan view illustrating a front face of the solar cell module shown in FIG. 1.

FIG. 10(a) is a schematic view illustrating a front face of another example of a cell block comprising a plurality of solar cells electrically connected with each other in the present invention.

FIG. 10 (b) is a schematic cross-sectional view, taken along the line F–F' in FIG. 10(a).

DESCRIPTION OF THE INVENTION AND PREFERRED EMBODIMENTS

Figure 1:
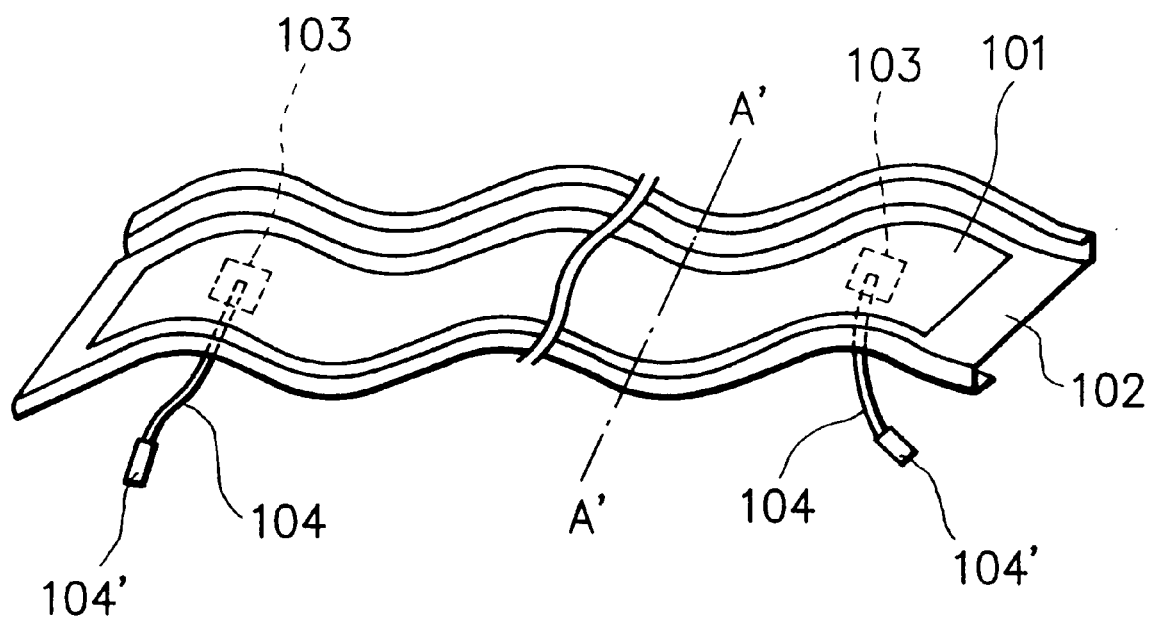
FIG. 1 is a schematic slant view illustrating an example of a solar cell module according to the present invention.

The present invention provides an improved solar cell module which is free of the foregoing problems found in the prior art and which excels in flexibility and exterior appearance, can be freely bent as desired and can be used as a building material such as a roofing material.

A first embodiment of the solar cell module according to the present invention comprises a cell block held on a reinforcing member while being sealed by a sealing resin, said cell block comprising a plurality of solar cells electrically connected with each other by an electrically conductive connection material, characterized in that a sliding material having a property of not bonding to said electrically conductive connection material but bonding to said sealing resin is interposed between said electrically conductive connection material and said sealing resin.

A second embodiment of the solar cell module according to the present invention comprises a cell block having electrically conductive power outputting means and which is held on a reinforcing member while being sealed by a sealing resin, said cell block comprising a plurality of solar cells electrically connected with each other by an electrically conductive connection material, characterized in that a sliding material having a property of not bonding both said electrically conductive power outputting means and said electrically conductive connection material but bonding to said sealing resin is interposed at least between said electrically conductive power outputting means and said sealing resin.

A third embodiment the solar cell module according to the present invention is that either said first embodiment or said second embodiment further comprises a surface protective film disposed so as to cover a front side of the cell block sealed by the sealing resin.

In the following, the present invention will be described in more detail while referring to the drawings.

FIG. 1 is a schematic slant view illustrating an example of a roof-integral type solar cell module according to the present invention which has a corrugated configuration similar to that of a roof tile. The corrugated configuration shown in FIG. 1 is not limiting. It may be optionally modified into an appropriate configuration comprising, for instance, a combination of recessed portions, protruded portions and flat portions. There is also no limitation for the radius of curvature of each of the protruded portions and recessed portions in the corrugated configuration. Various corrugated configurations comprising a variety of protruded portions and recessed portions having a different radius of curvature may be optionally employed. In any case, it is possible that no flat portion is present.

In FIG. 1, reference numeral 101 indicates a cell block (comprising a plurality of solar cells electrically connected with each other by means of an electrically conductive connection material) provided on a wave-like shaped reinforcing member 102.

Reference numeral 103 indicates a pair of terminal boxes provided on a back face of the reinforcing member 102. Each terminal box 103 is provided with a power out putting cable 104 which extends to the outside.

A power generated by the cell block 101 is outputted to the outside through the terminal boxes 103 and the power outputting cables 104. Each power outputting cable 104 is preferably connected to a lead wire as a connection means (not shown) in the corresponding terminal box 103. The lead wire in this case is electrically connected to a power outputting terminal of each solar cell.

Each power outputting cable 104 may be provided with a connector 104' at its end portion. In this case, the electrical connection of the solar cell module to other solar cell modules having a pair of connectors (104) or external wirings having relevant connectors can be readily conducted by connecting their connectors.

Figure 2:
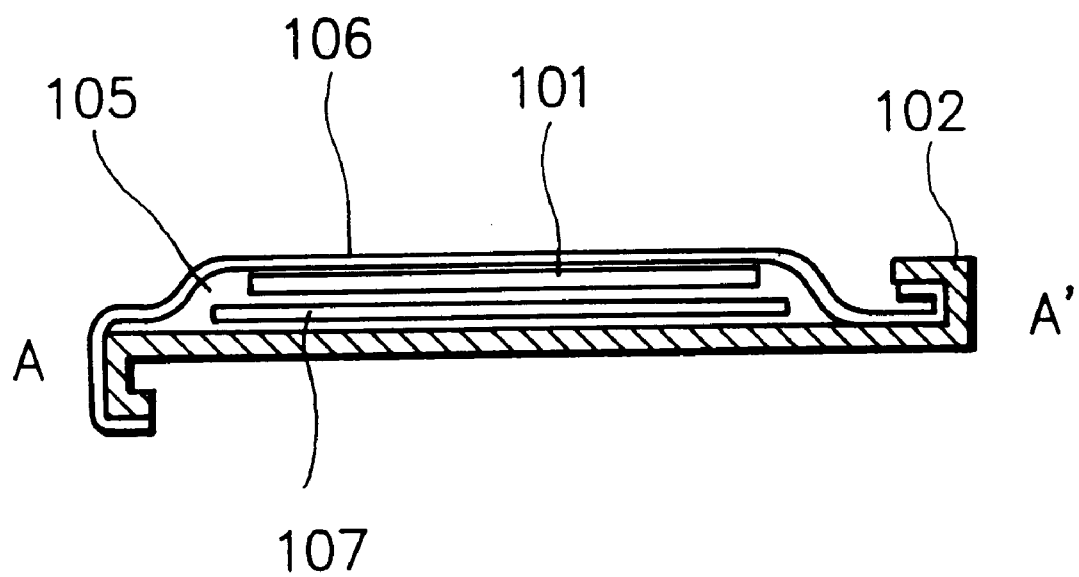
FIG. 2 is a schematic cross-sectional view of the solar cell module, taken along the A–A' line in FIG. 1.

Each of opposite end portions (in which no solar cell is present) of the reinforcing member 102 in the solar cell module shown in FIG. 1 is bent into a form (as shown in FIG. 2 which will be explained later) capable of meshing the solar cell modules with other solar cell module.

FIG. 2 is a schematic cross-sectional view, taken along the line A–A' in FIG. 1.

As shown in FIG. 2, the cell block 101 (shown in FIG. 1) is sealed by a filler material 105 comprising a resin (a sealing resin in other words) on the reinforcing member 102 where the cell block 101 is embedded in the filler material 105 so that the cell block is enclosed by the filler material, and a front side of the cell block 101 sealed by the filler material 105 is covered by a surface protective film 106. The surface protective film 106 is disposed to cover the entirety of the surface of the reinforcing member 102 as shown in FIG. 2.

In FIG. 2, reference numeral 107 indicates an insulating member disposed between the cell block 101 and the reinforcing member 102 so as to electrically isolate the cell block from the reinforcing member.

FIG; 3 is a schematic plan view illustrating a front face of the solar cell shown in FIG. 1.

As shown in FIG. 3, the cell block 101 shown in FIG. 1 comprises a plurality of solar cells 110 which are electrically connected with each other by means of an electrically conductive connection material 111.

Figure 4:
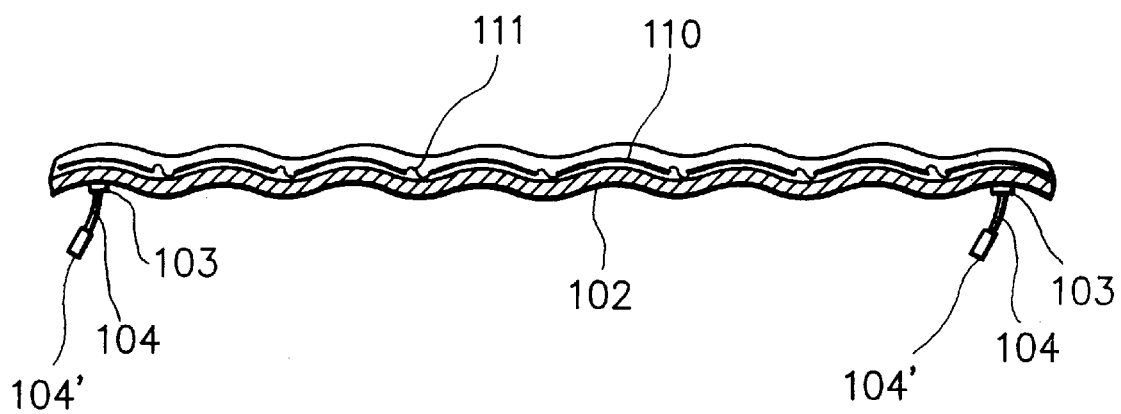
FIG. 4 is a cross-sectional view, taken along the line B–B' in FIG. 3.

FIG. 4 is a schematic cross-sectional view, taken along the line B–B' in FIG. 3.

As shown in FIG. 4, each of the two terminal boxes 103 having the power outputting cable 104 shown in FIG. 1 is positioned at a recessed portion of the back face of the reinforcing member 102.

In the following, the constitution of the cell block 101 in the present invention will be detailed with reference to FIGS. 5 and 6.

Figure 5:
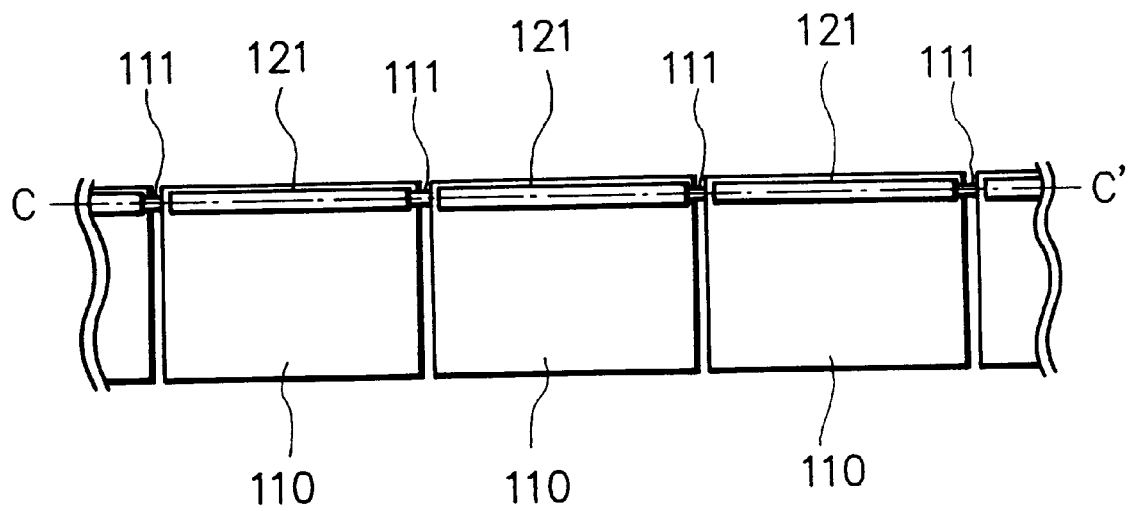
FIG. 5 is a schematic plan view illustrating a front face of an example of a cell block comprising a plurality of solar cells electrically connected with each other in the present invention.

FIG. 5 is a schematic plan view viewed from above, illustrating an example of a cell block in the present invention. FIG. 6 is a schematic cross-sectional view, taken along the line C–C' in FIG. 5.

Figure 6:
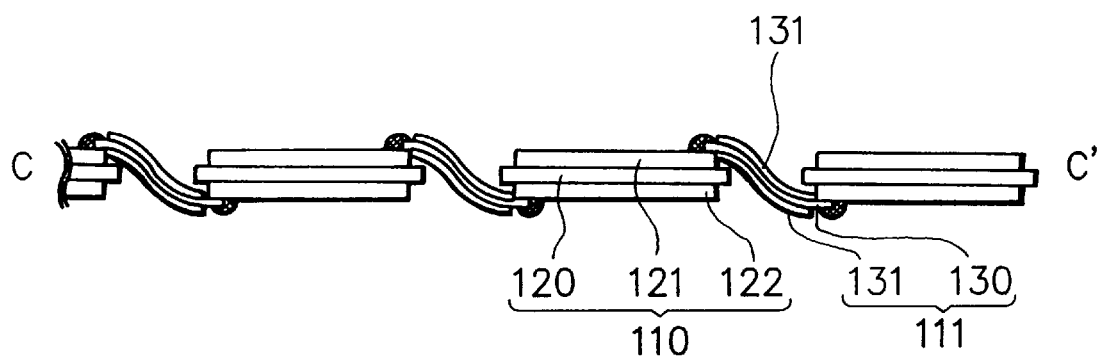
FIG. 6 is a schematic cross-sectional view of the cell block shown in FIG. 5, taken along the line C–C' in FIG. 5.

In FIGS. 5 and 6, reference numeral 101 indicates a cell block, reference numeral 110 a solar cell, reference numeral 111 a connection means, reference numeral 120 a photoelectric conversion member, reference numeral 121 an upper electrode, reference numeral 122 a lower electrode, reference numeral 130 an electrically conductive member, and reference numeral 131 a sliding material (or a sliding member).

The cell block 101 shown in FIGS. 5 and 6 comprises a plurality of solar cells 110 electrically connected with each other in series connection by means of a connection means 111. This series connection is not limitative. It is possible for the solar cells 110 to be electrically connected with each other by way of parallel connection using the connection means 111.

Each of the solar cells 110 comprises a photoelectric conversion member 120 having an upper electrode 121 and a lower electrode 122.

The connection means 111 comprises an electrically conductive connection material 130 sandwiched between a pair of sliding materials 131 to form an envelope-like structure in that the electrically conductive connection material 130 is enclosed by the pair of sliding materials 131 so as to expose only opposite end portions having a predetermined length of the electrically conductive connection material 130 to the outside. Alternatively, the connection means 111 may be designed to have a tubular structure comprising the electrically conductive connection material 130 enclosed in a hollow tube made of the sliding material 131 such that each of the opposite end portions having a predetermined length of the electrically conductive connection material is exposed to the outside.

The sliding material 131 has a property of not bonding to the electrically conductive connection material 130 but bonding to the foregoing filler material 105 (see FIG. 2).

In the electrical connection of the solar cells 110 in FIGS. 5 and 6, as shown in FIG. 6, each adjacent two solar cells 110 are electrically connected with each other through the electrically conductive connection material 130 of the connection means 111 such that one end of the electrically conductive connection material 130 is fixed to the lower electrode 122 of one of the two solar cells by means of, for instance, a solder and the other end of the electrically conductive connection material 130 is fixed to the upper electrode 121 of the remaining solar cell by means of, for instance, a solder, wherein the opposite sliding materials 131 of the connection means 111 are not fixed to the solar cells 110.

In the solar cell module (see FIG. 2) according to the present invention, the cell block 101 (see FIGS. 5 and 6) is embedded in the filler material 105 such that the cell block 101 is enclosed by the filler material 105, wherein the electrically conductive connection material 130 by which each adjacent two solar cells 110 of the cell block 101 are connected is enclosed by the sliding material 131 and only the sliding material 131 is directly bonded and fixed to the filler material 105 without the electrically conductive connection material 130 being directly contacted with the filler material 105. Because of this, the electrically conductive connection material 130 is hardly affected by a shrinkage stress caused upon bending the solar cell module. This situation desirably prevents the connection means 111 from separating from the filler material, whereby the electrically conductive connection material 130 is desirably prevented from suffering from problems such as cracking and the like. Hence, a highly reliable roof-integral type solar cell module can be realized.

In the above, it is possible to dispose a lubricant between the electrically conductive connection material 130 and the sliding material 131. In this case, the sliding property of the sliding material 131 is promoted, whereby the above advantages are more pronounced.

The solar cell module according to the present invention can be used not only as a roofing material but also as other building materials such as a walling material. For instance, in the case of use as a roofing material, the solar cell modules are sequentially arranged on a roof board or rafter from the hanging side while fixing by means of a clip, and they are engaged in mesh with each other. The roof comprising the solar cell modules thus installed establishes a power generation apparatus used together with a power conversion apparatus. It is possible for the power conversion apparatus to be designed such that it has a function linking it to commercial electric power.

Figure 7:
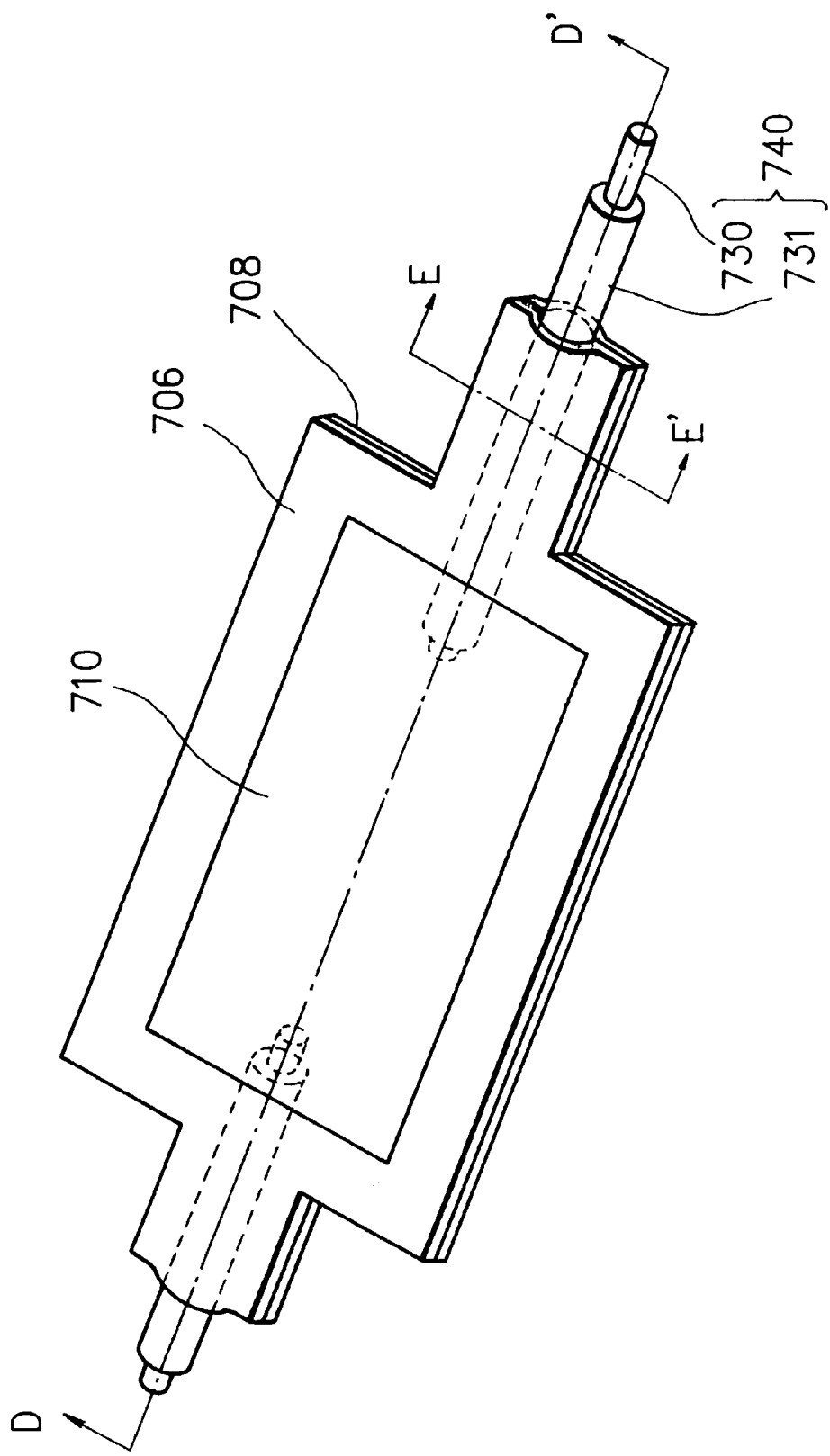
FIG. 7 is a schematic slant view illustrating another example of a solar cell module according to the present invention.

FIG. 7 is a schematic slant view illustrating another example of a solar cell module (which excels in flexibility) according to the present invention which has neither the foregoing reinforcing member nor the foregoing terminal box and can be optionally bent in a desired form.

Figure 8:
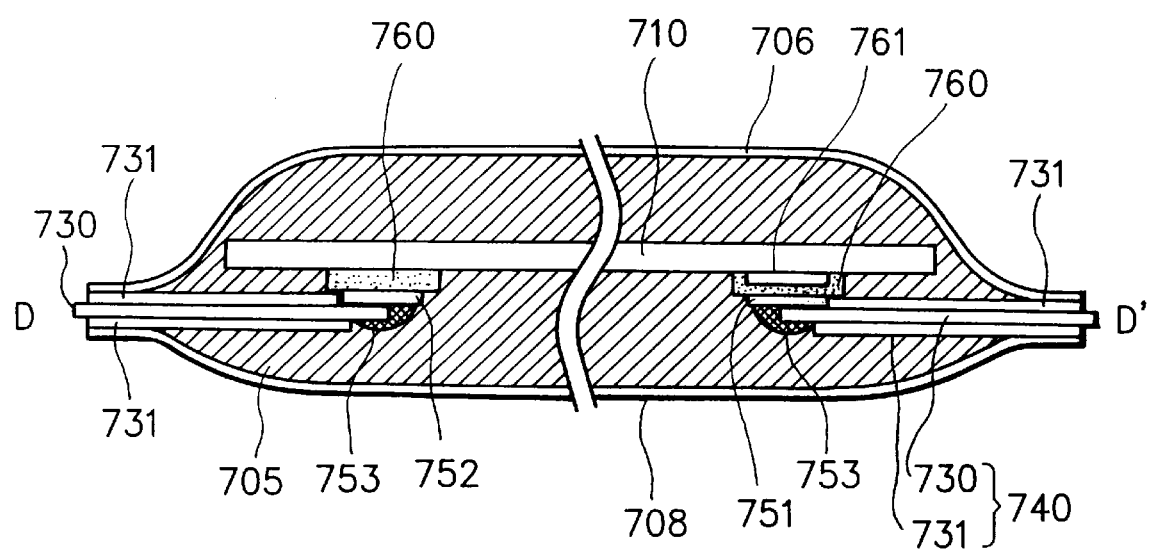
FIG. 8 is a schematic cross-sectional view of the solar cell module shown in FIG. 7, taken along the line D–D' in FIG. 7.
Figure 9:
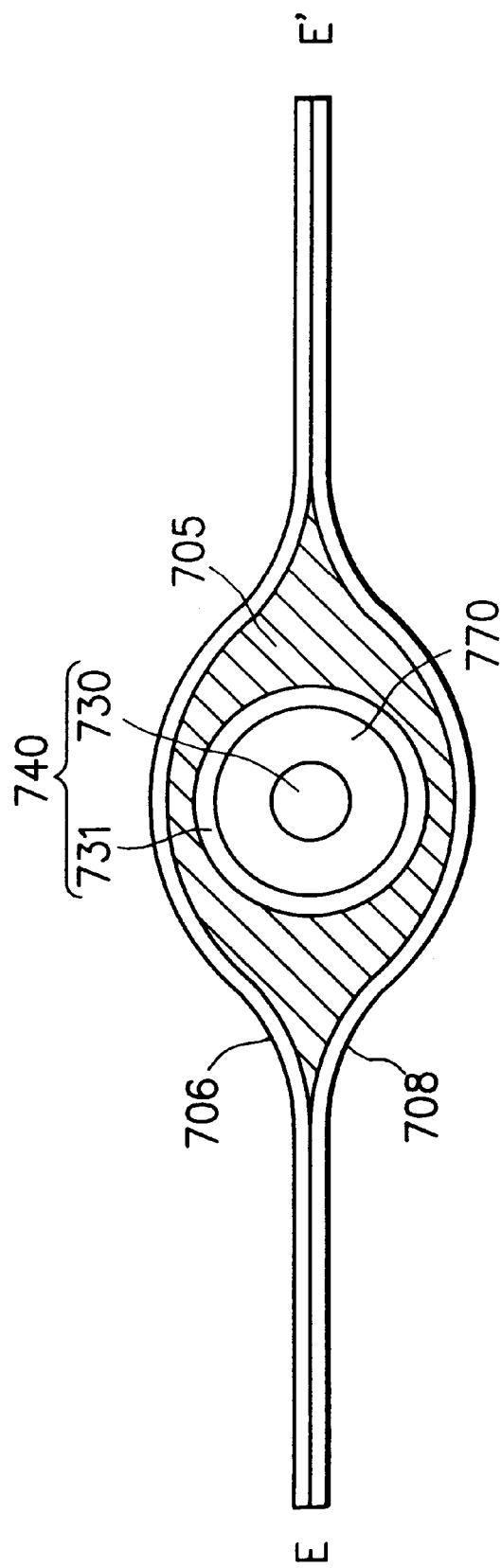
FIG. 9 is a schematic cross-sectional view of the solar cell module shown in FIG. 7, taken along the line E–E' in FIG. 7.

FIG. 8 is a schematic cross-sectional view, taken along the line D–D' in FIG. 7. FIG. 9 is a schematic cross-sectional view, taken along the line E–E' in FIG. 7.

In FIGS. 8 to 9, reference numeral 710 indicates a solar cell or a cell block (comprising a plurality of solar cells electrically connected with each other), the solar cell(s) comprising a photoelectric conversion member having an upper electrode on its front side and a lower electrode on its back side. In the following, description will be made of the case of using a solar cell.

For the remaining reference numerals in FIGS. 7 to 9, reference numeral 705 indicates a filler material comprising a resin (or a sealing resin), reference numeral 706 a surface protective film, reference numeral 708 a back face protective film, reference numeral 730 an electrically conductive connection material, reference numeral 731 a sliding material (or a sliding member), and reference numeral 740 a terminal material. Reference numeral 751 indicates an upper electrode's terminal, reference numeral 752 a lower electrode's terminal, and reference numeral 753 a solder. Reference numeral 760 indicates a heat resistant tape, reference 761 an insulating tape, and reference numeral 770 a lubricant.

In the solar cell module shown in FIGS. 7 to 9, as shown in FIGS. 7 and 8, a solar cell 710 (comprising a photoelectric conversion member having an upper electrode on its front side and a lower electrode on its back side) is sealed by a resin filler material 705, a front side of the solar cell 710 embedded in the resin filler material 705 is covered by a surface protective film 706, and a back side of the solar cell 710 embedded in the resin filler material 705 is covered by a back side protective film. Each of the surface protective film 706 and the back face protective film 708 is externally extended beyond the area where the solar cell 710 is present.

An upper electrode's terminal 751 extending from the upper electrode of the solar cell 710 is fixed to a predetermined position of the back face of the solar cell 710 through an insulating double-coated adhesive tape 761 so as to insulate the upper electrode's terminal 751 from the lower electrode of the solar cell 710. Further, in order to prevent the solar cell 710 from being damaged by heat upon soldering, a heat resistant double-coated adhesive tape 760 is interposed between the insulating double-coated adhesive tape 761 and the upper electrode's terminal 751 so as to cover the exposed portions of the insulating double-coated adhesive tape 761 as shown in FIG. 8.

Similarly, a lower electrode's terminal 752 is fixed to a predetermined position of the back face of the solar cell 710 through a heat resistant double-coated adhesive tape 760 as shown in FIG. 8, in order to prevent the solar cell 710 from being damaged by heat upon soldering.

A tubular terminal material 740 comprises an electrically conductive connection material 730 enclosed in a hollow tube made of a sliding material 731 such that each of the opposite end portions of the electrically conductive connection material 730 is exposed to the outside. One of the opposite externally exposed portions of the electrically conductive connection material 730 of the tubular terminal material 740 is fixed to the upper electrode's terminal 751 by means of a solder 753. Similarly, another tubular terminal material 740 (comprising an electrically conductive connection material 730 enclosed in a hollow tube made of a sliding material 731 such that each of the opposite end portions of the electrically conductive connection material 730 is exposed to the outside) is fixed to the lower electrode's terminal 752 by soldering (753) one of the opposite externally exposed portions of the electrically conductive connection material 730 of the tubular terminal material to the lower electrode's terminal 752.

The remaining end portion of each of the two tubular terminal materials 740 (each having an exposed portion of the electrically conductive connection material 730) is extended to the outside through one of the opposite sealed end portions (each comprising the tubular terminal material 740 covered by the surface protective film 706 and the back face protective film 708) (see FIG. 9) of the solar cell module. If necessary, the thus extended end portion of each of the two electrically conductive connection materials 730 may be provided with a connector or the like.

Although this is not shown in the figure, it is possible to configure such that the remaining end portion of one of the two tubular terminal materials 740 and that of the remaining tubular terminal material are together extended to the outside through one of the opposite sealed end portions of the solar cell module.

The sliding material 731 has a property of not bonding to the electrically conductive connection material 730 but bonding to the filler material 705 (see FIG. 8).

It is possible to arrange an appropriate insulating member between the solar cell 710 and the back face protective film 708, if necessary.

As above described, FIG. 9 is a schematic cross-sectional view illustrating the constitution of an end portion of the solar cell module shown in FIG. 7.

In the solar cell module (shown in FIGS. 7 to 9) according to the present invention, the solar cell 710 is embedded in the filler material 705 such that the solar cell 710 is enclosed by the filler material 705, and the two tubular terminal materials 740 each comprising the electrically conductive connection material 730 enclosed in the tube made of the sliding material 731 are also embedded in the filler material 705 such that only the sliding material 731 is directly bonded and fixed to the filler material 705 without the electrically conductive connection material 730 being directly contacted with the filler material 705. Because of this, the electrically conductive connection material 730 is hardly affected by a shrinkage stress caused upon bending the solar cell module.

This situation desirably prevents the terminal material 740 from separating from the filler material 705, where the electrically conductive connection material 730 is desirably prevented from suffering from problems such as cracking and the like. Hence, a highly reliable flexible solar cell module can be realized.

In the above, it is possible to dispose a lubricant 770 between the electrically conductive connection material 730 and the sliding material 731 as shown in FIG. 9. In this case, the sliding performance of the sliding material 731 is facilitated, whereby the above advantages are more pronounced.

In the following, description will be made of each constituent of the solar cell module according to the present invention.

Electrically Conductive Connection Material

The electrically conductive connection material (130, 730) serves to electrically connect a pair of solar cells. It also serves to output an electric power generated by the solar cells to the outside.

As the electrically conductive connection material, any materials can be optionally used as long as they are electrically conductive. However, in order to make protrusions generated in a solar cell module as small as possible and also in order for the electrically conductive connection material to have and maintain sufficient electric conductivity, it is desired to use a metallic material (including a metal foil) of Cu, Ag, Al, Ni, and Sn. In addition, a tin-plated copper foil is also usable. In order for the electrically conductive connection material to have superior flexibility, the electrically conductive connection material is desired to comprise Cu. In the case where a tubular material comprising the electrically conductive connection material (130, 730) enclosed in a hollow tube made of the sliding material (131, 731) is used, as such tubular material, it is possible to use a covered metal wire comprising a metal wire made of any of the foregoing metals which is covered by a given sliding material.

Sliding Material

The sliding material (131, 731) functions to protect the electrically conductive connection material (130, 730) while insulating the electrically conductive connection material. It is necessary for the sliding material (131, 731) to be configured, for instance, into such envelope-like structure as above described above or such tubular structure as above described in which the electrically conductive connection material (130, 730) enclosed therein can be freely moved therein when external pressure is applied on the electric wirings.

As the sliding material (131, 731), there can be mentioned, for example, fluororesins such as ethylene-tetrafluoroethylene copolymer, polytrifluoroethylene, and polyvinyl fluoride, and other resins such as PET (polyethylene terephthalate), polyimide, polyetherimide, polyethylene naphthalate, polyphenyl sulfide, and nylon.

In the case of covering the electrically conductive connection material (130, 730) by any of these resins, when the electrically conductive connection material comprises a foil-like shaped body, it is possible that the foil-like shaped body is sandwiched between a pair of members made of a given resin such that the foil-like shaped body is enclosed by the two members. It is possible to enclose the electrically conductive connection material (130, 730) by a single member made of any of the foregoing resins as the sliding material (131, 731), where the member is bent so as to envelope the electrically conductive connection material (130, 730).

It is also possible that the electrically conductive connection material (130, 730) is inserted in a hollow tube made of any of the foregoing resins as the sliding material (131, 731) such that the electrically conductive connection material is enclosed in the hollow tube while exposing opposite end portions having a predetermined length of the electrically conductive connection material to the outside.

Lubricant

As previously described, an appropriate lubricant (770) may be disposed between the electrically conductive connection material (130, 730) and the sliding material (131, 731) by way of coating or the like.

The lubricant thus disposed serves to establish a freely movable state having lubricity between the electrically conductive connection material (130, 730) and the sliding material (131, 731), which facilitates the electrically conductive connection material to move smoothly when the electrically conductive connection material is bent by virtue of external pressure applied thereon.

Specific examples of the lubricant are silicone grease, silicone oil compound, and silicone resin.

The lubricant is desired to have a relatively high viscosity in order to prevent the lubricant from leaking to the outside.

Solar Cell

The solar cell (110, 710) can include single crystalline silicon solar cells and non-single crystalline solar cells. Specific examples of such non-single crystalline solar cell are polycrystalline silicon solar cells, microcrystalline silicon solar cells, amorphous silicon solar cells, and compound semiconductor solar cells such as a copper indium selenide solar cell. These solar cells used as the solar cell (110, 710) are desired to have flexibility.

In any case, any of these solar cells (110, 710) is provided with an upper electrode (121) and a lower electrode (122) for outputting an electricity generated by the solar cell. These electrodes are formed of an electrically conductive metallic material such as a copper material, silver material, aluminum material, tin material, or tin-plated copper material. These electrodes are desirably flexible.

Reinforcing member

The reinforcing member (102) serves to improve the physical strength of the solar cell module. Particularly, in view of using the solar cell module as a roofing material of a building, the reinforcing member is required to have flexibility and to excel in weather resistance, load-withstanding capacity, and workability.

As the reinforcing member (102), steel sheets excelling in physical strength and non-ferrous metal or alloy sheets excelling in corrosion resistance which are ordinarily used in forming a metal roof can be optionally used. Such sheet can include steel sheets and non-ferrous metal or alloy sheets respectively having a treated surface or a coated surface, special steel sheets, and composite steel sheets laminated with a heat insulation material.

Specific examples of such steel sheets are hot-dip zinc-coated steel sheets, GALFAN sheets (trademark name), galvanized steel sheets, hot-dip aluminum-coated steel sheets, copper-plated steel sheets, vinyl chloride-coated steel sheets, fluororesin-coated steel sheets, stainless steel sheets, laminated damping steel sheets, heat-insulating zinc-coated steel sheets, atmospheric corrosion resisting steel sheets, coated steel sheets, coated color steel sheets. Specific examples of such non-ferrous metal or alloy sheets are copper sheets, lead sheets, titanium sheets, aluminum alloy sheets, and zinc alloy sheets.

Besides these, flexible plastic sheets which are ordinarily used in forming a roof of a building can be used as the reinforcing member (102).

Terminal Box

The terminal box (103) serves not only to protect the power-outputting portion (the terminal taking-out portion in other words) of the solar cell (101) from being damaged due to mechanical pressure externally applied thereto, but also to protect the joint portions of the cables (104) with the power-outputting portions from being damaged due to foreign matter such as moisture, dusts or the like. In this connection, the terminal box is required to excel in heat resistance, water resistance, electric insulation, and durability.

In order to satisfy these requirements, the terminal box is desirably constituted of a plastic material. Taking flame resistance into consideration, it is more desirable that the terminal box is constituted by a slow burning plastic or ceramic.

Specific examples of such plastic are engineering plastics excelling in physical strength, impact hardness, and durability such as polycarbonate, polyamide, polyacetal, noryl resin, modified PPO (polyphenylene oxide), polyester, polyarylate, unsaturated polyester, phenol resin, and epoxy resin. In addition, thermoplastics such as ABS (acrylonitrile butadiene styrene) resin, PP (polypropylene), and PVC (polyvinyl chloride) are also usable.

Separately, it is desired that a lead wire is provided at the terminal taking-out portion, and the lead wire is connected to the cable (104) through a connector. The lead wire in this case is desirably covered by the foregoing sliding material.

Cable

The pair of power outputting cables (104) extending from the power outputting portions of the solar cell module serve to output an electric power generated in the solar cell module. They also serve to electrically connect the solar cell module to other solar cell modules or to external wirings. In this respect, it is desired for each power outputting cable (104) to be provided with a connector (104') at its end portion (see FIGS. 1, 3 and 4), where the electrical connection of the solar cell module to other solar cell modules having a pair of connectors (104) or to external wirings having relevant connectors can be readily conducted by connecting their connectors.

Each of the cables (104) is desired to be configured such that a soft electrically conductive core wire made of a soft metal such as copper is covered by an insulating layer and said insulating layer by which the core wire is covered by is covered a protective surface layer.

The insulating layer may be constituted by an insulating material selected from the group consisting of vinyl chloride, chloroprene, crosslinked polyethylene, natural rubber, ethylene propylene rubber, silicone resin, fluororesin, and inorganic sliding materials. The protective surface layer may be constituted by a material selected from the group consisting of vinyl chloride, chloroprene, polyethylene, polyurethane, silicone resin, fluororesin, and metals.

The connectors (104') comprise a positive connector and a negative connector. Each of these connectors comprises a connection mechanism installed in a housing, which can mesh with that of the other connector so as to connect the two connectors. The housing herein is constituted by a material selected from the group consisting of polyethylene, polycarbonate, and polybutyleneterephthalate.

Filler Material

The filler material (105, 705) serves to seal the solar cell (110, 710) and to fix the reinforcing member (102), the surface protective film (106, 706), the insulating member (107), and the back face protective film (708) by virtue of the adhesive bonding of the filler material.

The filler material (105, 705) desirably comprises one or more resins selected from the group consisting of EVA (ethylene-vinyl acetate copolymer), butyral resin, silicone resin, and epoxy resin.

The filler material (105, 705) may contain a glass fiber material therein in order to improve the scratch resistance of the solar cell module.

In addition, the filler material (105, 705) may contain an ultraviolet (UV) absorber which absorbs ultraviolet rays which would otherwise deteriorate.

Surface Protective Film

The surface protective film (106, 706) serves to protect the front surface of the solar cell module and to maintain it in an insulated state.

The surface protective film is desirably comprises a film formed of a fluororesin selected from the group consisting of ethylene-tetrafluoroethylene copolymer, polytrifluoroethylene, and polyvinyl fluoride.

For the fluororesin film used as the surface protective film (106, 706), its surface to be contacted with the filler material may be applied with corona treatment or primer treatment in order to improve its adhesion with the filler material.

Insulating Member

The insulating member (107) serves to ensure the insulation between the cell block (101) and the reinforcing member (102).

The insulating member desirably comprises an insulating film formed of nylon, polyethyleneterephthalate, or a fluororesin selected from the group consisting of ethylene-tetrafluoroethylene copolymer, polytrifluoroethylene, and polyvinyl fluoride.

In the case of using a fluororesin film as the insulating member, at least a surface thereof to be situated on the side of the cell block is desired to be applied with corona treatment or primer treatment in order to improve its adhesion with the filler material.

The insulating member (107) comprising any of the above insulating films may be directly laid on the surface of the reinforcing member (102).

Back Face Protective Film

The back face protective film (708) is used in the case of a flexible solar cell module in which no reinforcing member (102) is used, in order to protect the back face of said solar cell module.

The back face protective film (708) desirably comprises a film formed of any of the foregoing polymer materials used for the formation of either the surface protective film (106, 706) or the insulating member (107).

In the following, the present invention will be described in more detail with reference to examples. It should be understood that these examples are only for illustrative purposes, and the present invention is not restricted to these examples.

EXAMPLE 1

In this example, there was prepared a roof-integral type solar cell module having such configuration as shown in FIGS. 1 to 6.

As the cell block (101) shown in FIGS. 1 to 6, there was used a cell block configured as shown FIGS. 10 to 12.

Figure 11A:
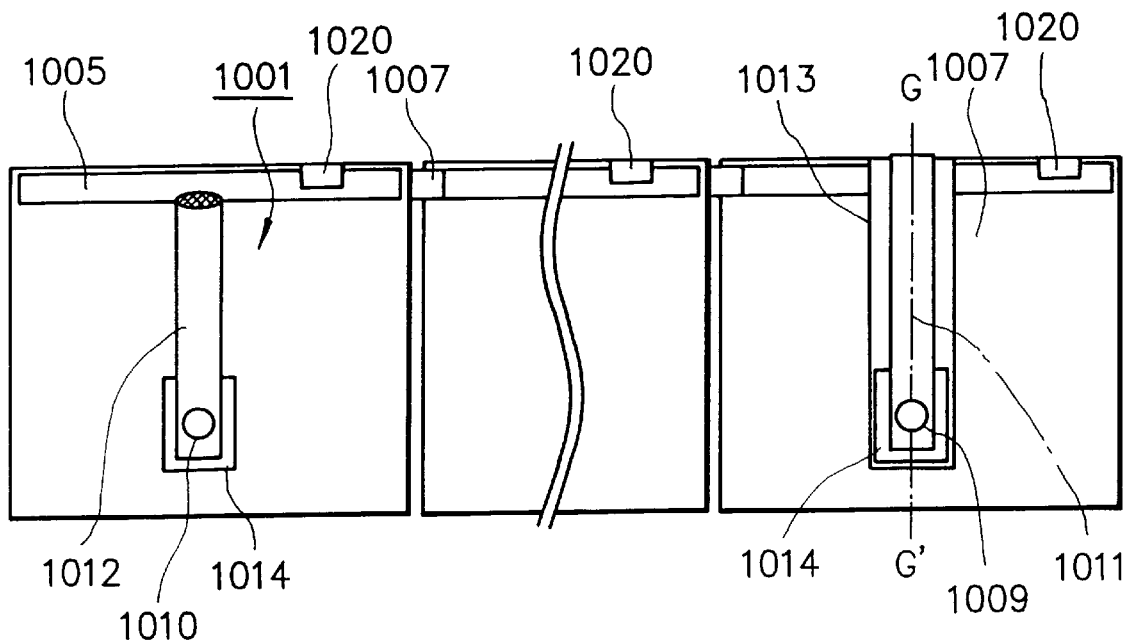
FIG. 11(a) is a schematic view illustrating a back face of the cell block shown in FIG. 10(a).
Figure 11B:
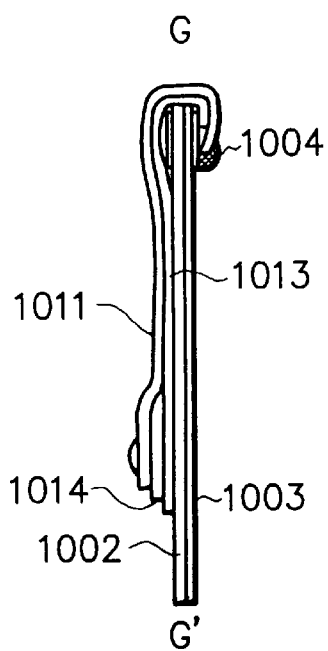
FIG. 11(b) is a schematic cross-sectional view, taken along the line G–G' in FIG. 11 (a).
Figure 12A:
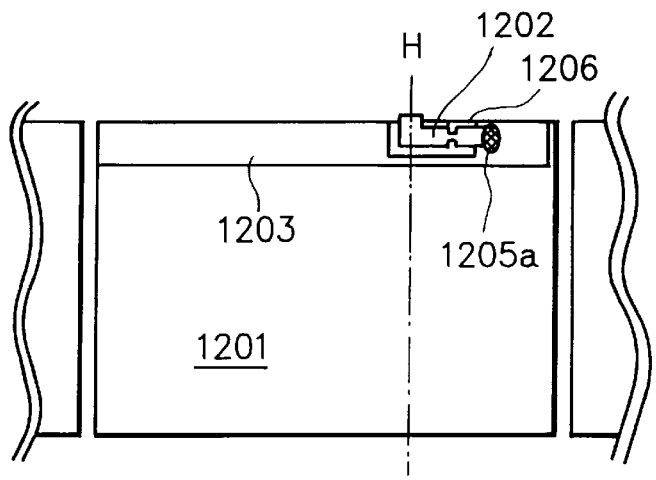
FIG. 12(a) is a schematic view illustrating an example of a connection structure of a bypass diode in a solar cell module according to the present invention.
Figure 12B:
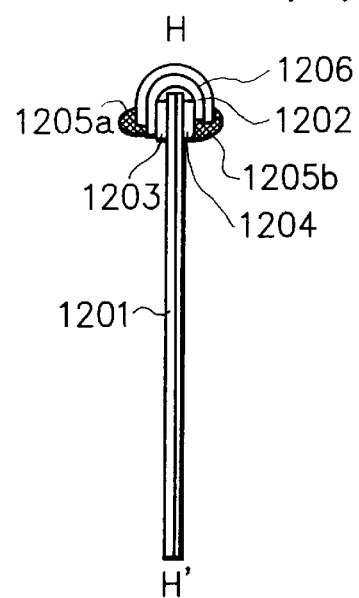
FIG. 12(b) is a schematic cross-sectional view, taken along the line H–H' in FIG. 12(a).
Figure 12C:
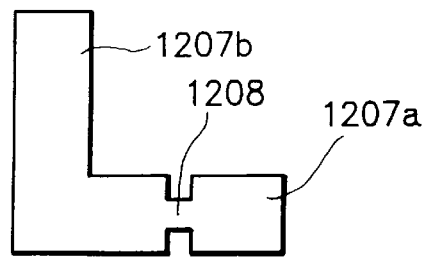
FIG. 12(c) is a schematic explanatory view of the bypass diode shown in FIG. 12(a).

Herein, FIG. 10 (*a*) is a schematic plan view illustrating a front face of a cell block used in this example. FIG. 10(*b*)

is a schematic cross-sectional view, taken along the line F–F' in FIG. 10(a). FIG. 11 (a) is a schematic view illustrating a back face of the cell block shown in FIG. 10(a). FIG. 11(b) is a schematic cross-sectional view, taken along the line G–G' in FIG. 11(a). FIG. 12(a) is a schematic view illustrating a connection structure of a bypass diode installed in the cell block shown in FIG. 10(a). FIG. 12(b) is a schematic cross-sectional view, taken along the line H–H' in FIG. 12(a). FIG. 12(c) is a schematic explanatory view of the bypass diode shown in FIG. 12(a).

In this example, the roof-integral type solar cell module was prepared as will be described below.

Preparation of Cell Block

There were provided a plurality of solar cells 1001. Each solar cell 1001 comprises a semiconductor layer 1003 (as a photoelectric conversion semiconductor layer) comprising an amorphous silicon semiconductor material formed on an electrically conductive substrate 1002 comprising a stainless steel plate of 125 μm in thickness. Herein, the substrate 1002 functions as a negative side, and the surface of the semiconductor layer 1003 functions as a positive side. An upper electrode 1004 comprising a copper foil of 100 μm in thickness is laminated on an end portion of the surface of the semiconductor layer 1003 (see FIGS. 10(a) and 10(b)), and an lower electrode 1005 comprising a copper foil of 100 μm in thickness is laminated on an end portion of the back surface of the substrate 1002 (see FIG. 10(b)). A plurality of wire electrodes 1006 made of an electrically conductive material as a collecting electrode is spacedly laid at a substantially equal interval on the front surface of the semiconductor layer 1003, and they are connected to the upper electrode 1004 (as the common electrode in this case). At the lower electrode, a bypass diode 1020 is provided.

These solar cells 1001 each being configured as above described were electrically connected with each other in series connection in a manner of electrically connecting each adjacent two solar cells 1001 by electrically connecting the upper electrode 1004 of one of the two solar cells to the lower electrode 1005 of the other solar cell by means of an electrically conductive connection means 1007.

As the electrically conductive connection means 1007, there was used an envelope-like structured connection material comprising an electrically conductive connection material comprising a copper foil of 100 μm in thickness and 7 mm in width sandwiched between a pair of PET (polyethylene terephthalate) films of 50 μm in thickness and 7 mm in width as the sliding material such that the copper foil is enclosed by the two PET films so as to expose only opposite end portions having a predetermined length of the copper foil to the outside.

One of the exposed opposite end portions of the copper foil of the connection material as the connection means 1007 was fixed to the above upper electrode 1004 by means of a solder, and the remaining exposed portion of the copper foil was fixed to the above lower electrode 1005 by means of a solder.

In the above, there was provided a clearance 1008 of 2 mm in width between each adjacent two solar cells 1001 (see FIG. 10(a)). This increases the arrangement density of solar cells thereby increasing an electric power generated in the solar cell module.

By this, there was obtained a cell block.

This cell block is provided with a pair of terminal taking-out portions, i.e., a positive side terminal taking-out portion 1009 and a negative side terminal taking-out portion 1010 for outputting an electric power generated by the cell block (see, FIG. 10(a)). The arrangement positions of these two portions 1009 and 1010 should be properly determined depending upon the design of a solar cell module produced. For instance, they should be properly determined in accordance with the lengths of lead wires and cables used and correlated positions to the connection counterparts.

The positive side terminal taking-out portion 1009 and the upper electrode 1004 of the solar cell 1001 where the positive side terminal taking-out portion 1009 is positioned were electrically connected by an upper electrode terminal 1011 wired between them. Similarly, the negative side terminal taking-out portion 1010 and the lower electrode 1005 of the solar cell 1001 where the negative side terminal taking-out portion 1010 is positioned were electrically connected by a lower electrode terminal 1011 wired between them. The upper electrode terminal 1011 herein was laminated using a double-coated insulating tape 1013 so as to insulate the upper electrode terminal from the substrate 1002 (see FIG. 11(b)).

As each of the upper and lower electrode terminals 1011 and 1012, there was used a soft copper foil of 40 μm in thickness and 20 μm in width.

Because a lead wire member (not shown) will be later soldered to each of the terminal taking-out portions 1009 and 1010, a heat resistant tape 1014 (comprising a woven glass fiber) was provided just below the upper electrode terminal 1011 in the vicinity of the terminal taking-out portion 1009 (that is, between the upper electrode terminal 1011 and the insulating tape 1013), and similarly, another heat resistant tape 1014 (comprising a woven glass fiber) was provided just below the lower electrode terminal 1012 in the vicinity of the terminal taking-out portion 1010 (that is, between the lower electrode terminal 1012 and the substrate 1002).

Then, a lead wire member (not shown) was fixed to each of the terminal taking-out portions 1009 and 1010 by means of a solder. Each lead wire member herein comprises an electrically conductive material comprising a copper foil of 40 μm in thickness and 20 μm in width sandwiched between a pair of black-colored PET (polyethylene terephthalate) films of 50 μm in thickness as sliding materials such that the copper foil is enclosed by the two PET films so as to expose only the opposite end portions of the copper foil to the outside.

Description will be made of the bypass diode 1020 provided in each of the solar cells 1001 shown in FIGS. 10 and 11 with reference to FIGS. 12(a) to 12 (c).

As previously described, FIG. 12(a) is a schematic view illustrating a connection structure of the bypass diode (1020) provided in each of the solar cells (1001) shown in FIG. 10(a). FIG. 12(b) is a schematic cross-sectional view, taken along the line H–H' in FIG. 12(a). FIG. 12(c) is a schematic explanatory view of the bypass diode shown in FIG. 12(a).

In FIGS. 12(a) and 12(b), reference numeral 1201 indicates a solar cell (corresponding to the foregoing solar cell 1001), reference numeral 1202 a bypass diode (corresponding to the foregoing bypass diode 1020), reference numeral 1203 a lower electrode (corresponding to the foregoing lower electrode 1005), and reference numeral 1204 an upper electrode (corresponding to the foregoing upper electrode 1004). Each of reference numerals 1205a and 1205b indicates a solder, reference numeral 1206 an insulating tape, each of reference numerals 1207a and 1207b a ribbon, and reference numeral 1208 a flat diode chip.

As the bypass diode 1202 (that is, as the foregoing bypass diode 1020), there was used a flat diode chip 1208 of 1.5 mm×1.5 mm in size provided with ribbons 1207a and 1207b as shown in FIG. 12(c). As shown in FIGS. 12(a) and 12(b), the bypass diode 1202 was arranged between the upper and lower electrodes 1204 and 1203 of the solar cell 1201. Particularly, the bypass diode 1202 was arranged on an insulating tape 1206 laid on the lower electrode 1203. The ribbon 1207a was connected to the lower electrode 1203 by means of a solder 1205a. The ribbon 1207b shaped in a curved form was extended from the rear side to the front side, and it was connected to the upper electrode 1204 by means of a solder 1205b. Each of the two ribbons 1207a and 1207b herein comprises a soft copper foil of 0.1 mm in thickness.

Preparation of Solar Cell Module

Using the cell block prepared in the above, there was prepared a solar cell module having such configuration as shown in FIGS. 1 to 6 as will be described below.

On a 0.4 mm thick galvanized steel sheet (trademark name: TIMACOLOR GL, produced by Daido Steel Sheet Mfg. Co., Ltd.) as the reinforcing member 102, there were sequentially laminated an EVA (ethylene-vinylacetate copolymer) sheet as the filler material 105, a 50 $\mu$m thick PET film (a film formed of polyethyleneterephthalate) as the insulating member 107, an EVA (ethylene-vinylacetate copolymer) sheet as the filler material 105, the cell block prepared in the above as the cell block 101, an EVA (ethylene-vinylacetate copolymer) sheet as the filler material 105, and a 50 $\mu$m thick non-oriented ETFE (ethylene-tetrafluoroethylene copolymer) film (trademark name: TEFZEL, produced by Du Pont Company) as the surface protective film 106, whereby a stacked body was obtained.

Using a conventional laminator, the resultant stacked body was subjected to thermocompression bonding treatment at 160° C. for 50 minutes under conditions of evacuating the inside of the laminator and compressing the stacked body, where the EVA sheets 105 were fused to seal the cell block 101 together with the insulating member 107 between the reinforcing member 102 and the surface protective film 106. By this, there was obtained a flat solar cell module.

In the above, the thickness of each of the two EVA sheets as the filler material 105 on the side of the reinforcing member 102 was adjusted so that the interval between the cell block 101 and the insulating member 107 was 230 $\mu$m, and the interval between the insulating member 107 and the reinforcing member 102 was 230 $\mu$m.

Using a roller former, each of the opposite end portions (in which no solar cell is present) of the resultant solar cell module was bent at a radius of curvature of more than 3 mm to have a bent configuration having such a cross-section as shown in FIG. 2. This bending was conducted so that no roller of the roll former was contacted to the portion of the solar cell module in which the cell block 101 is present. The formation of the opposite bent portions using the roll former was completed in 12 seconds.

The solar cell module thus treated was processed to have such a corrugated cross-section as shown in FIG. 4 by way of press working treatment. Particularly, the press working treatment was conducted by pressing the solar cell module from above and below by means of a pair of dies in a corrugated shape for about one second, whereby the solar cell module was made into a configuration having eight corrugated forms (comprising a recessed portion and a protruded portion) which are arranged in contrast to either side.

Finally, a pair of terminal boxes 103 were provided at predetermined positions of the back face of the solar cell module. Particularly, the predetermined two portions of the reinforcing member 102 corresponding to the terminal taking-out portions of the cell block 101 had been perforated prior to the module formation so as to expose the positive and negative terminal taking-out portions. To each terminal taking-out portion, a lead wire was soldered, followed by fixing a terminal box 103 made of polycarbonate for the purposes of insulating protection and waterproofing. Then in the terminal box, the foregoing power outputting cable 104 having a connector at its end portion was fixed to the lead wire by means of a solder.

Evaluation

The solar cell module obtained in the above was evaluated with respect to endurance against environments with high temperature and high humidity and endurance against changes in environmental temperature and humidity cycle tests in the following manner.

(1) Evaluation of the Endurance Against Environments With High Temperature and High Humidity The solar cell module was maintained in an atmosphere with 85° C./85% RH for 3,000 hours. After this, the exterior appearance of the solar cell module was optically observed.

As a result, it was found that the solar cell module is free of peeling or cracking in the exterior and its original exterior appearance is maintained.

(2) Evaluation of the Endurance Against Changes in Environmental Temperature and Humidity The solar cell module having maintained in the atmosphere with 85° C./85% RH for 3,000 hours in evaluation (1) was subjected to 100 repetitions of a cycle of alternately exposing it to an atmosphere of –40° C. for 0.5 hour and exposing it to an atmosphere of 85° C./85%RH for 20 hours. After this, the solar cell module was optically examined.

As a result, it was found that the solar cell module does not have any distinguishable peeling at the interfaces between the connection materials and the filler material and any distinguishable cracking in the electrically conductive connection materials. The reason why neither peeling nor cracking occurred in the solar cell module, although the solar cell module had been subjected to bending and press working treatments and was repeatedly exposed to severe environmental conditions, is believed to be that the electrically conductive connection materials in the connected portions of the solar cell module are covered by the sliding materials (the PET films).

EXAMPLE 2

In this example, there was prepared a flexible solar cell module having such configuration as shown in FIGS. 7 to 9, which can be desirably installed on any curved places.

As the solar cell 710 in FIG. 7, there was used a cell block configured as shown in FIGS. 10 to 12 which was prepared in the same manner as in Example 1. However, for each of the two solar cells (1001) respectively situated on one of the opposite end sides of the cell block, a terminal member for outputting an electric power to the outside was provided at the back face thereof.

Figure 13:
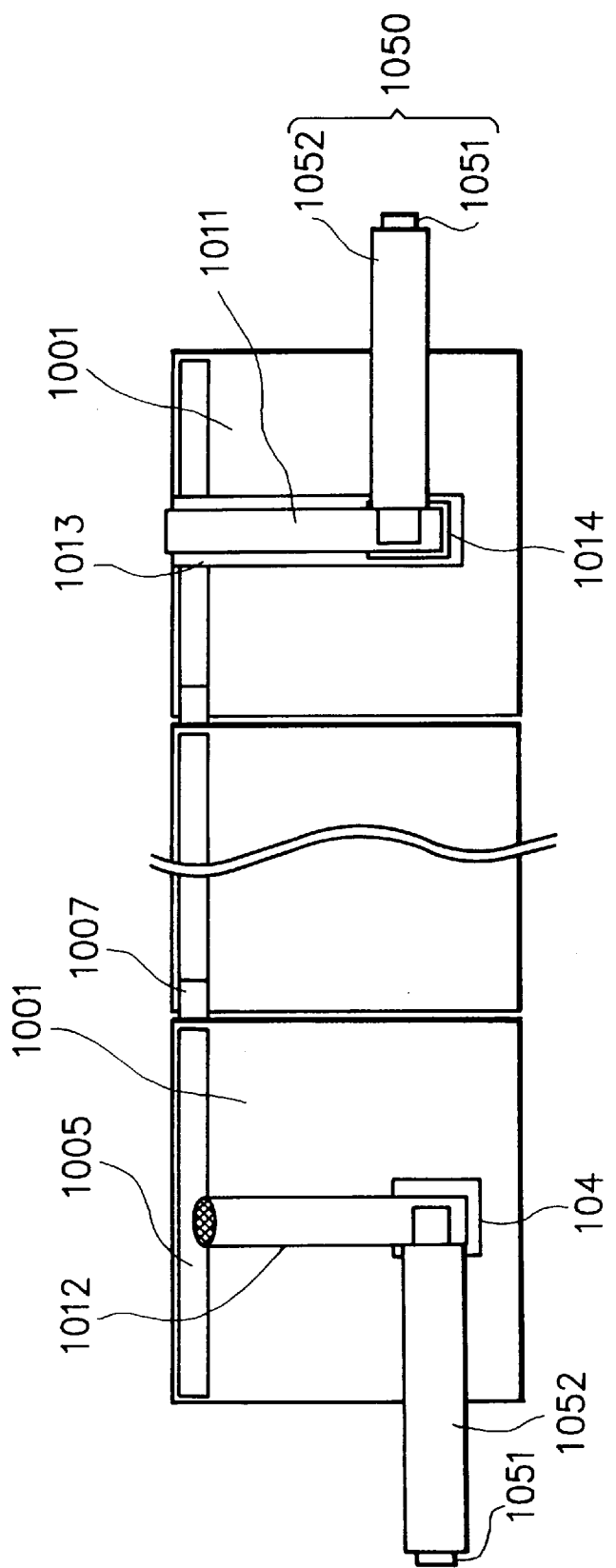
FIG. 13 is a schematic view illustrating a back face of a further example of a cell block comprising a plurality of solar cells electrically connected with each other in the present invention.
Figure 14:
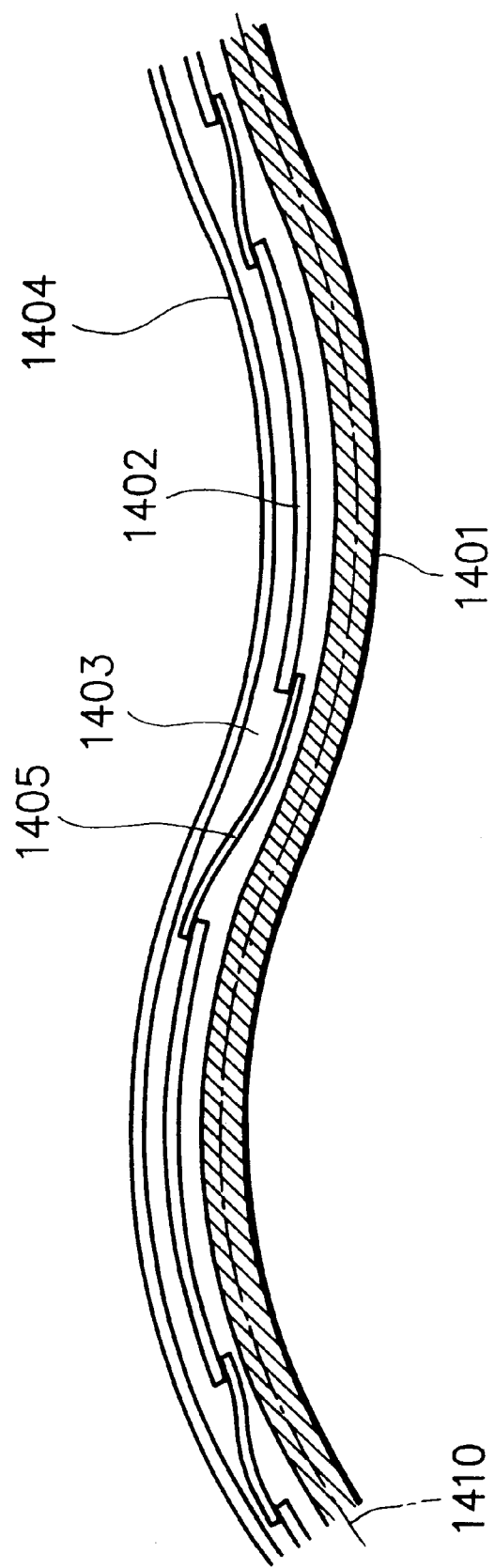
FIG. 14 is a schematic cross-sectional view illustrating the constitution of an example of a conventional solar cell module.

FIG. 13 is a schematic view illustrating the configuration the back face of the above cell block.

In FIG. 13, reference numeral 1050 indicates a power outputting terminal member comprising a columnar electrically conductive connection material 1051 composed of a soft copper material and having a diameter of 1.8 mm which is enclosed in a hollow tube 1052 made of a black PET (polyethylene terephthalate) as the sliding material and having an inner diameter of 3.4 mm and an outer diameter of 6.4 mm such that opposite end portions having a predetermined length of the electrically conductive connection material 1051 are exposed to the outside. The clearance between the electrically conductive material 1051 and the inner wall face of the hollow tube 1052 is filled with a lubricant comprising silicone grease.

Being different from Example 1, as shown in FIG. 13, the terminal member 1050 structured as above described was fixed to each of the upper and lower electrode terminals 1011 and 1012 by means of a solder through one of the opposite exposed end portions (comprising the electrically conductive connection material 1051) of the terminal member. In this case, each of the upper and lower electrode terminals 1011 and 1012 and the electrically conductive connection material 1051 may be designed to have an integral structure.

The remaining constituents of the cell block in this example are the same as those in the cell block in Example 1.

Using the above cell block, a flexible solar cell module having such configuration as shown in FIGS. 7 to 9 was prepared as will be described below.

On a 50 μm thick black-colored PVF (polyvinyl fluoride) film (trademark name: TEDLAR, produced by Du Pont Company) as the back face protective film 708, there were sequentially laminated an EVA (ethylene-vinylacetate copolymer) sheet as the filler material 705, the foregoing cell block 710, an EVA (ethylene-vinylacetate copolymer) sheet as the filler material 705, and a 50 μm thick non-oriented ETFE (ethylene-tetrafluoroethylene copolymer) film (trademark name: TEFZEL, produced by Du Pont Company) as the surface protective film 106, whereby a stacked body was obtained.

Using a conventional laminator, the resultant stacked body was subjected to thermocompression bonding treatment at 160° C. for 50 minutes under conditions of vacuuming the inside of the stacked body and compressing the stacked body, where the EVA sheets 705 were fused to seal the cell block 710 between the back face protective film 708 and the surface protective film 106. By this, there was obtained a flexible solar cell module.

In the above, the thickness of each of the EVA sheets as the filler material 705 was adjusted so that the filler material 705 having a thickness of 230 μm was filled between the cell block 701 and the back face protective film 708.

The resultant solar cell module was found to be free from occurrence of cracking in the electric wiring portions including the electrical connection portions and the terminal portions even when the solar cell module is variously bent, because the electrically conductive connection materials used in those portions are covered by the PET as the sliding material.

In the solar cell module in this example, no reinforcing member is used. Therefore, it is very thin and light-weight and excels in flexibility. Hence, the solar cell module can be desirably installed on any curved place.

Separately, taking these advantages of the solar cell module, the solar cell module was laid on a roof of an automobile. Particularly, the solar cell module was laid on the roof of the automobile such that the center of the cell block portion of the solar cell was positioned at a central portion of the roof of the automobile, and the solar cell module was fixed using a double-coated adhesive tape. In this case, the solar cell module may be fixed using a magnet.

Then, the terminal members of the solar cell module were entrapped between the rubber members between the roof portion and the hatch portion of the automobile, and they were bent to wire into the interior of the automobile.

By this, the wirings of the solar cell module could be readily taken into the interior of the automobile simply by bending the terminal members of the solar cell module without hindering their weather resistance. By the way, in the case where a conventional solar cell module having a reinforcing member is installed on the roof of an automobile, it is difficult for its electric wirings to be readily taken into the interior unless the roof of the automobile is perforated.

Further, in the solar cell module obtained in this example, the flexible back face protective film was used but no reinforcing member was used. Because of this, the solar cell module could be desirably laid on the roof of the automobile so as to sufficiently follow the shape of the roof.

Herein, in the case of producing a flexible solar cell module for use in an automobile in the manner as above described, it is desired for the two terminal members 1050 to be designed such that they are extended in the same direction.

EXAMPLE 3

The procedures of Example 2 were repeated, except that a lubricant comprising silicone grease was coated between the electrically conductive material and the sliding materials of each electrically conductive connection means by which each adjacent two solar cells are electrically connected, to thereby obtain a flexible solar cell module having such configuration as shown in FIGS. 7 to 9, which can be desirably installed on any curved place.

In the thermocompression bonding treatment of the stacked body upon producing the solar cell module, substantially no air bubbles was remained in the stacked body as the solar cell module because the silicone grease as the lubricant was used in not only in the terminal members, but also in each of the electrically conductive connection means by which each adjacent two solar cells are electrically connected.

For the resultant solar cell module, it was found that the prevention of cracking of the electric wiring portions including the electrical connection portions and the terminal portions even when the solar cell module is variously bent is further improved.

As well as the solar cell module of Example 2, in the solar cell module in this example, no reinforcing member is used. Therefore, it is very thin and light-weight and excels flexibility. Hence, the solar cell module can be desirably installed on any curved place.

Clearly, as described in the above Examples 1 to 3, enclosing the electrical connection means and the lead wire members by using an appropriate sliding material enables the production of a desirable solar cell module at an improved yield.

As apparent from the above description, the present invention provides such advantages as will be described in the following, which cannot be easily expected from the prior art.

By covering the exteriors of the electrically conductive connection materials in the electric connection means or/and the terminal members by an appropriate sliding material, even when the electrically conductive connection materials are bent, they are desirably maintained without being separated from the filler material and without from cracking. This enables the efficient production of a highly reliable solar cell module at an improved yield. It also enables the efficient production of a flexible solar cell module which always maintains its insulating property without the solar cells arranged therein being deteriorated even when its terminal members are partially exposed to the external environment outdoors.

In addition, because improved reliability against folding can be achieved, it is possible to realize a roof-integral type solar cell module having a desired design such as a corrugated form and which can be desirably used as a roofing material of a building. It is also possible to realize a highly reliable and flexible solar cell module having no reinforcing member.

What is claimed is:

1. A solar cell module comprising a cell block sealed by a sealing resin, said cell block comprising a plurality of solar cells electrically connected with each other by an electrically conductive connection material, characterized in that a sliding material having a property of not bonding to said electrically conductive connection material but bonding to said sealing resin is interposed between said electrically conductive connection material and said sealing resin.

2. A solar cell module according to claim 1, wherein the sliding material comprises a pair of sliding members composed of the sliding material and the electrically conductive connection material is sandwiched between said pair of sliding members such that the electrically conductive connection material is enveloped by said pair of sliding members so that opposite connection portions of the electrically conductive connection material are exposed to the outside.

3. A solar cell module according to claim 1, wherein the sliding material comprises a hollow tube made of the sliding material in which the electrically conductive connection material is enclosed such that opposite connection portions of the electrically conductive connection material are exposed to the outside.

4. A solar cell module according to claim 1, wherein the electrically conductive connection material comprises a metallic material.

5. A solar cell module according to claim 4, wherein the metallic material comprises at least a metal selected from the group consisting of Cu, Ag, Al, Ni, and Sn.

6. A solar cell module according to claim 1, wherein the sliding material comprises a resin.

7. A solar cell module according to claim 1, wherein the sliding material comprises at least a polymer selected from the group consisting of ethylene-tetrafluoroethylene copolymer, polytrifluoroethylene, polyvinyl fluoride, polyethylene trephthalate, polyimide, polyetherimide, polyethylene naphthalate, polyphenyl sulfide, and nylon.

8. A solar cell module according to claim 1, wherein a lubricant is disposed between the electrically conductive connection material and the sliding material.

9. A solar cell module according to claim 8, wherein the lubricant is a material selected from the group consisting of silicone grease, silicone oil compound, and silicone resin.

10. A solar cell module according to claim 1, wherein the cell block sealed by the sealing resin is held on a reinforcing member.

11. A solar cell module according to claim 1, wherein the cell block sealed by the sealing resin is covered by a surface protective film and a back face protective film.

12. A power generation apparatus comprising a solar cell module defined in claim 1 and a power converter connected to said solar cell module.

13. A solar cell module comprising a cell block having an electrically conductive power outputting means and which is sealed by a sealing resin, said cell block comprising a plurality of solar cells electrically connected with each other by an electrically conductive connection material, characterized in that a sliding material having a property of not bonding to both said electrically conductive power outputting means and said electrically conductive connection material but bonding to said sealing resin is interposed at least between said electrically conductive power outputting means and said sealing resin.

14. A solar cell module according to claim 13, wherein the sliding material is also interposed between the electrically conductive connection material and the sealing resin.

15. A solar cell module according to claim 14, wherein a lubricant is disposed between the electrically conductive connection material and the sliding material.

16. A solar cell module according to claim 13, wherein the sliding material comprises a pair of sliding members composed of the sliding material and the electrically conductive power outputting means is sandwiched between said pair of sliding members such that the electrically conductive power outputting means is enveloped by said pair of sliding members so that opposite connection portions of the electrically conductive power outputting means are exposed to the outside.

17. A solar cell module according to claim 13, wherein the sliding material comprises a hollow tube made of the sliding material in which the electrically conductive power outputting means is enclosed such that opposite connection portions of the electrically conductive power outputting means are exposed to the outside.

18. A solar cell module according to claim 13, wherein the electrically conductive power outputting means comprises a metallic material.

19. A solar cell module according to claim 18, wherein the metallic material comprises at least a metal selected from the group consisting of Cu, Ag, Al, Ni, and Sn.

20. A solar cell module according to claim 13, wherein the sliding material comprises a resin.

21. A solar cell module according to claim 13, wherein the sliding material comprises at least a polymer selected from the group consisting of ethylene-tetrafluoroethylene copolymer, polytrifluoroethylene, polyvinyl fluoride, polyethylene trephthalate, polyimide, polyetherimide, polyethylene naphthalate, polyphenyl sulfide, and nylon.

22. A solar cell module according to claim 13, wherein a lubricant is disposed between the electrically conductive power outputting means and the sliding material.

23. A solar cell module according to claim 22 or 15, wherein the lubricant is a material selected from the group consisting of silicone grease, silicone oil compound, and silicone resin.

24. A solar cell module according to claim 13, wherein the cell block sealed by the sealing resin is held on a reinforcing member.

25. A solar cell module according to claim 13, wherein the cell block sealed by the sealing resin is covered by a surface protective film and a back face protective film.

26. A solar cell module according to claim 25, wherein the electrically conductive power outputting means and the sliding material are covered by the surface protective film and the back face protective film.

27. An installation method for installing a solar cell module defined in claim 13, said method comprising the steps of arranging said solar cell module on a roof of an automobile and introducing an electrically conductive power outputting means of said solar cell module arranged on said roof into a room of said automobile through a window portion or a door portion of said automobile.

28. An installation method according to claim 27, wherein the solar cell module is fixed to the roof of the automobile by means of a double-coated adhesive tape or a magnet.

29. A building material comprising a cell block sealed by a sealing resin on a reinforcing member and a surface protective film which covers a front side of said cell block sealed by said sealing resin, said cell block comprising a plurality of solar cells electrically connected with each other by an electrically conductive connection material, characterized in that a sliding material having a property of not bonding to said electrically conductive connection material but bonding to said sealing resin is interposed between said electrically conductive connection material and said sealing resin.

30. A building material according to claim 29, wherein the sliding material comprises a pair of sliding members composed of the sliding material and the electrically conductive connection material is sandwiched between said pair of sliding members such that the electrically conductive connection material is enveloped by said pair of sliding members so that opposite connection portions of the electrically conductive connection material are exposed to the outside.

31. A building material according to claim 29, wherein the sliding material comprises a hollow tube made of the sliding material in which the electrically conductive connection material is enclosed such that opposite connection portions of the electrically conductive connection material are exposed to the outside.

32. A building material according to claim 29, wherein the electrically conductive connection material comprises a metallic material.

33. A building material according to claim 32, wherein the metallic material comprises at least a metal selected from the group consisting of Cu, Ag, Al, Ni, and Sn.

34. A building material according to claim 29, wherein the sliding material comprises a resin.

35. A building material according to claim 29, wherein the sliding material comprises at least a polymer selected from the group consisting of ethylene-tetrafluoroethylene copolymer, polytrifluoroethylene, polyvinyl fluoride, polyethylene trephthalate, polyimide, polyetherimide, polyethylene naphthalate, polyphenyl sulfide, and nylon.

36. A building material according to claim 29, wherein a lubricant is disposed between the electrically conductive connection material and the sliding material.

37. A building material according to claim 36, wherein the lubricant is a material selected from the group consisting of silicone grease, silicone oil compound, and silicone resin.

38. A building material according to claim 29, wherein the reinforcing member has a corrugated form.

39. An excecution method comprising the steps of fixing a building material defined in claim 29 and joining said building material with a building material adjacent to said building material.

* * * * *

UNITED STATES PATENT AND TRADEMARK OFFICE
CERTIFICATE OF CORRECTION

PATENT NO. : 5,998,729
DATED : December 7, 1999
INVENTOR(S) : SATORU SHIOMI ET AL.

It is certified that error appears in the above-identified patent and that said Letters Patent is hereby corrected as shown below:

COLUMN 4

Line 41, "the" (1st occurrence) should read --of the--.

COLUMN 5:

Line 3, "out putting" should read --outputting--;
　　Line 22, "module." should read --modules.--; and
　　Line 53, "viewed" should be deleted.

COLUMN 7:

Line 34, "reference 761" should read --reference numeral 761--.

COLUMN 9:

Line 31, "above" (2nd occurrence) should be deleted.

COLUMN 11:

Line 40, "is" (2nd occurrence) should be deleted; and
　　Line 41, "covered" (2nd occurrence) should be deleted.

COLUMN 12:

Line 8, "deteriorate." should read --deteriorate the solar cell.--; and
　　Line 15, "is" should be deleted.

UNITED STATES PATENT AND TRADEMARK OFFICE
CERTIFICATE OF CORRECTION

PATENT NO.   : 5,998,729
DATED        : December 7, 1999
INVENTOR(S)  : SATORU SHIOMI ET AL.

It is certified that error appears in the above-identified patent and that said Letters Patent is hereby corrected as shown below:

COLUMN 13:

Line 25, "an" should read --a--.

COLUMN 18:

Line 32, "was" should be deleted;
    Line 34, "in" (2nd occurrence) should be deleted;
    Line 45, "excels" should read --excels in--; and
    Line 63, "from" should be deleted. (second occurrence)

Signed and Sealed this

Thirtieth Day of January, 2001

Q. TODD DICKINSON

*Attest:*

*Attesting Officer*      *Director of Patents and Trademarks*